(12) United States Patent
Hool et al.

(10) Patent No.: US 9,648,728 B1
(45) Date of Patent: May 9, 2017

(54) CORELESS ORGANIC SUBSTRATE

(71) Applicant: ALTERA CORPORATION, San Jose, CA (US)

(72) Inventors: Vincent Hool, Pleasanton, CA (US); Susan Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/601,973

(22) Filed: Jan. 21, 2015

(51) Int. Cl.
*H01L 25/18* (2006.01)
*H01L 25/065* (2006.01)
*H05K 1/02* (2006.01)
*H01L 23/00* (2006.01)
*H01L 23/14* (2006.01)
*H05K 1/03* (2006.01)
*H05K 1/11* (2006.01)

(52) U.S. Cl.
CPC ......... *H05K 1/0271* (2013.01); *H01L 23/145* (2013.01); *H01L 24/81* (2013.01); *H05K 1/0326* (2013.01); *H05K 1/111* (2013.01); *H01L 2924/1515* (2013.01); *H01L 2924/1579* (2013.01)

(58) Field of Classification Search
CPC ................. H01L 23/3675; H01L 23/13; H01L 23/49827; H01L 23/50; H01L 23/367; H01L 24/83; H01L 25/0657; H01L 25/18; H01L 25/50; H01L 27/10844; H01L 21/563
USPC .................................. 257/738; 438/107, 124
See application file for complete search history.

(56) References Cited

U.S. PATENT DOCUMENTS

| | | | |
|---|---|---|---|
| 2009/0294156 A1* | 12/2009 | Ueno ..................... H01L 23/13 174/255 |
| 2010/0104895 A1* | 4/2010 | Hsu ..................... H01M 8/0221 429/456 |
| 2011/0049221 A1* | 3/2011 | Blais .................... B23K 1/0016 228/179.1 |
| 2015/0236001 A1* | 8/2015 | Coteus ................... H01L 25/18 257/712 |

\* cited by examiner

*Primary Examiner* — Thomas L Dickey
*Assistant Examiner* — Changhyun Yi

(57) ABSTRACT

A coreless organic substrate in which a mounting hole is formed near each corner of the substrate and is used during assembly processes to secure the substrate so as to prevent flexing.

27 Claims, 8 Drawing Sheets

CORELESS ORGANIC SUBSTRATE

BACKGROUND

Conventional organic substrates, especially the larger ones, rely on a thick core layer to maintain substrate stiffness during component assembly and printed circuit board (PCB) assembly. Without a core, the substrate is too flexible during component or board assembly; and the substrate is prone to warpage in a package. Such warpage can result in interconnect failures at the die and the substrate solder bump joint or at the substrate and the printed circuit board (PCB) ball grid array (BGA) joint. Such warpage can also result in substrate cracks.

SUMMARY

In one aspect, the present invention is an improved organic substrate in which a mounting hole is formed near each corner of the substrate and is used during assembly processes to secure the substrate so as to prevent flexing. This arrangement makes it possible to use a thinner substrate thereby reducing package cost and improving the power distribution network of the package. The substrate provides better high speed signal impedance match and reduced signal reflection. This arrangement also makes it possible to reduce warpage thereby increasing overall assembly yield.

In other aspects, the invention includes apparatus and methods for using the substrate in assembly processes.

Numerous variations may be practiced in these embodiments.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
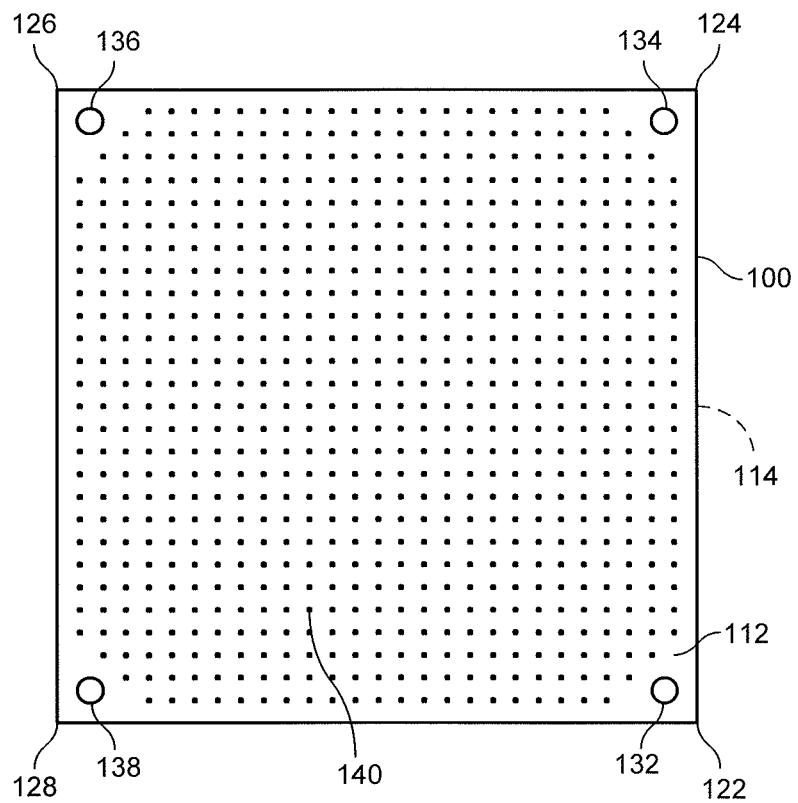
FIG. 1 is a bottom view of an illustrative embodiment of the invention.

FIG. 1 is a bottom view of an illustrative embodiment of a device substrate 100 of the invention. Device substrate 100 has a first major surface 112 that is visible in the bottom view of FIG. 1 and a second major surface 114 on the opposite side of the substrate. Device substrate is formed of a coreless, organic substrate such as an epoxy resin such as FR-4. Device substrate 100 is rectangular in shape, having four corners 122, 124, 126, 128. While device substrate 100 as shown in FIG. 1 is a square, in other embodiments the length and width of the substrate may be different. Near each of the four corners is a hole 132, 134, 136, 138 that extends through the substrate from one major surface to the other major surface.

During various assembly processes that are described more fully below, the four holes are mounted on pins to secure the substrate and thereby prevent flexing of the substrate.

Device substrate 100 typically has a plurality of electrical conductors (not shown in FIG. 1) extending across and/or through the substrate. In the embodiment shown in FIG. 1, a two-dimensional, rectilinear array of bonding pads 140 is formed on the first major surface of substrate. These pads are connected to the plurality of electrical conductors that extend through the substrate. Illustratively, the electrical conductors connect to other electrical circuitry such as integrated circuits, and/or discrete devices on the second major surface of the substrate.

Figure 2:
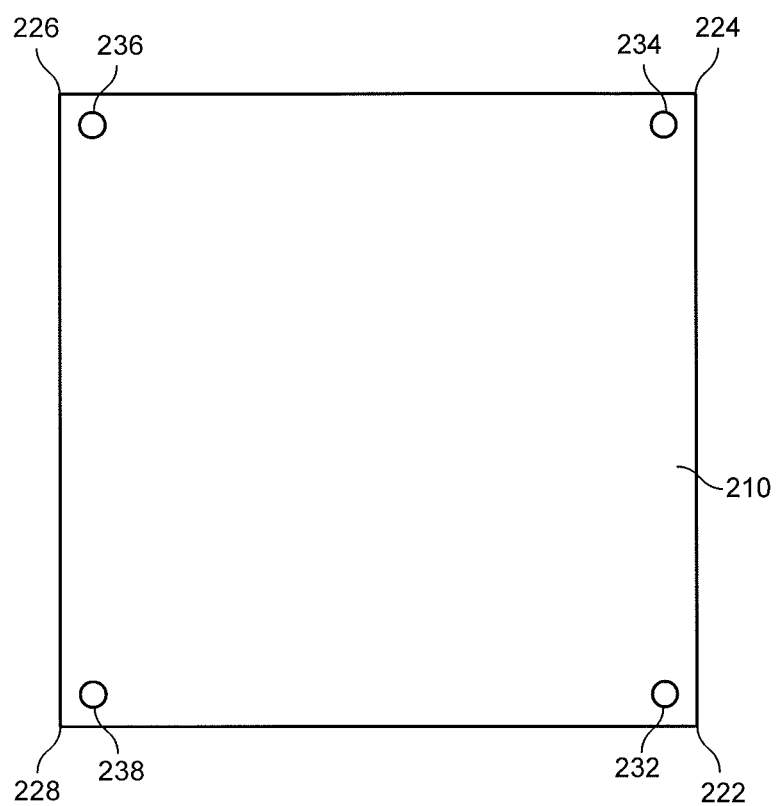
FIG. 2 is a top view of the embodiment of FIG. 1 of the invention.

FIG. 2 is a top view of device substrate 100 after a rectangular lid 210 has been mounted on the second major surface of the substrate. The lid has four corners 222, 224, 226, 228 and is co-extensive with the underlying substrate. The lid includes four holes 232, 234, 236, 238 near the four corners and aligned with the four holes 132, 134, 136, 138 in the substrate.

Figure 3:
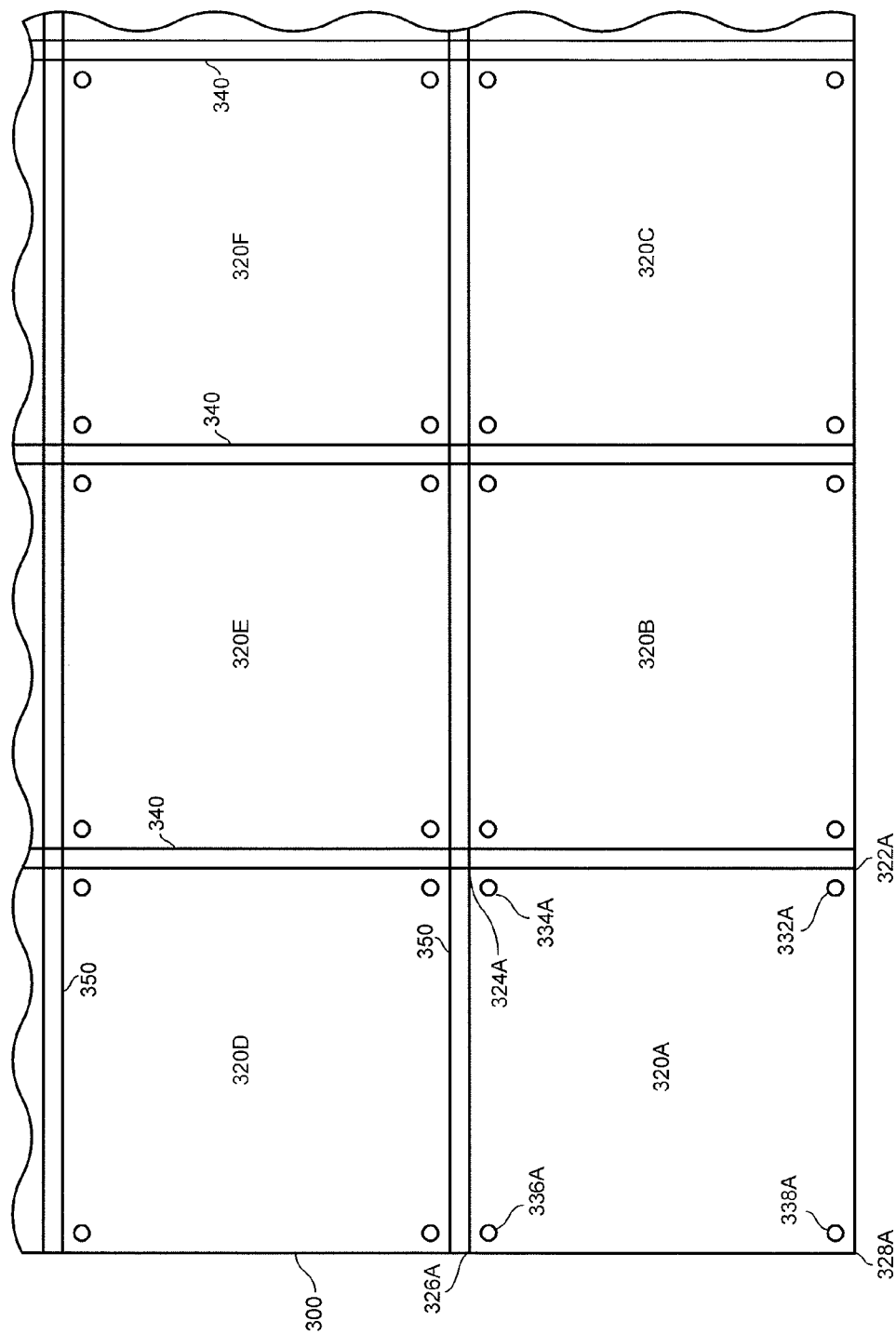
FIG. 3 is a top view of a second illustrative embodiment of the invention.

Device substrates can be made one-at-a-time. Preferably, however, a large number of substantially identical device substrates are formed simultaneously in a single sheet of substrate material; and individual device substrates are then separated (or singulated) from the sheet for further processing. FIG. 3 depicts a sheet 300 of substrate material in which a rectilinear two-dimensional array of rectangular substrates 320A-F is formed. After the sheet of substrates is formed, holes 332$n$, 334$n$, 336$n$ and 338$n$ are made in the four corners 322$n$, 324$n$, 326$n$, 328$n$ of each substrate, where n designates the particular substrate. After the holes are made at the corners of the substrates, the substrates are separated from the sheet by scribing the sheet along vertical and horizontal scribe lines 340, 350.

Figure 4:
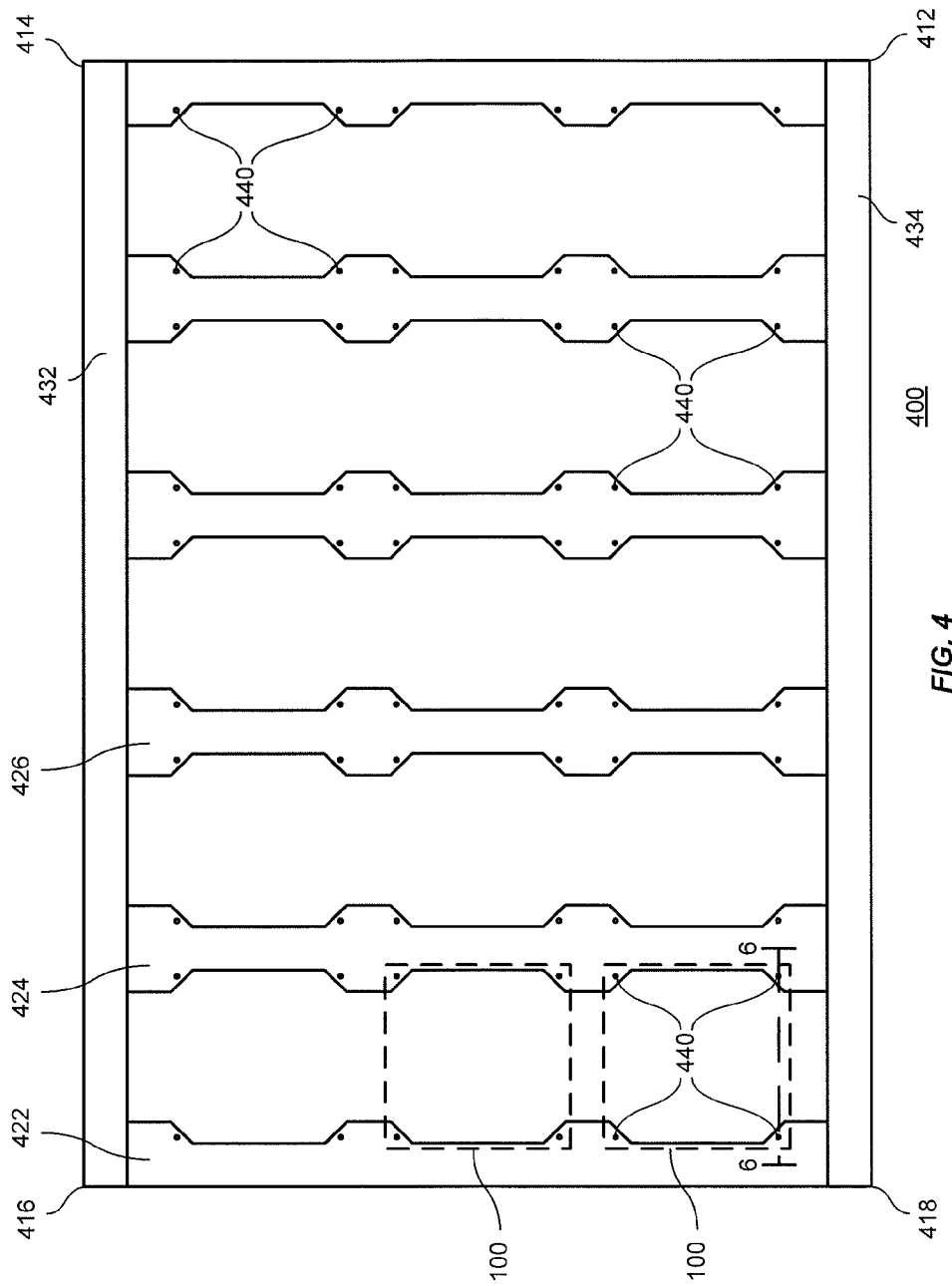
FIGS. 4 and 5 are views of an illustrative carrier frame used in the practice of the invention.
Figure 5:
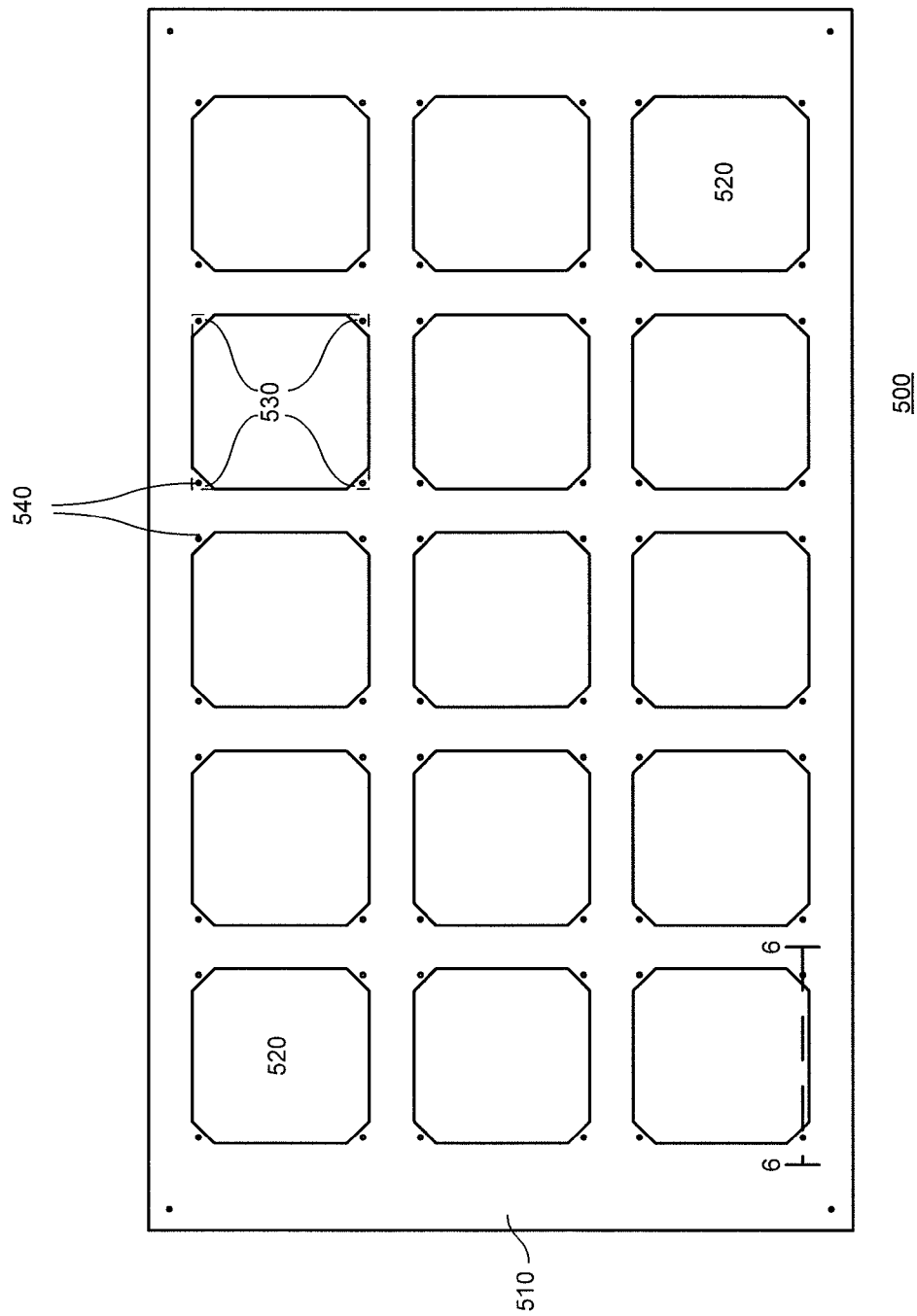

FIGS. 4 and 5 are views of lower and upper co-operating elements 400, 500 of a rectangular carrier fixture for mounting a plurality of device substrates 100 for further processing.

Lower element 400 is rectangular in shape having four corners 412, 414, 416, and 418. Element 400 comprises a rectangular array of a plurality of spaced-apart, substantially parallel bars 422, 424, 426, . . . supporting a plurality of pins 440. As shown in FIG. 4, bars 422, 424, . . . are held in place by traversing bars 432, 434; but other mounting arrangements will be apparent to those skilled in the art.

The spacing of the bars and the position of the pins on the bars are such that each device substrate can be mounted on the pins by fitting the holes in the corners of the substrate over two adjacent pins on one bar and two adjacent pins on an adjacent bar. For purposes of illustration in FIG. 4, two device substrates 100 are depicted by dotted lines in the lower left-hand corner of the array mounted adjacent one another on pins 440 on bars 422, 424. It will be understood that additional substrates can be similarly mounted on other pins so as to fill the array.

Upper element 500 likewise is rectangular in shape and is co-extensive with element 400. Element 500 comprises a rectangular screen-like web 510 with a plurality of holes 520, each of which is approximately the size and shape of a device substrate except that a portion of the web bridges a triangular segment 530 at each corner of each hole. Within each triangular segment, there is a small hole 540 such that four small holes are found in the triangular segments 530 at the four corners of each large hole 520. The spacing of these four small holes is the same as the spacing of the pins 440 on the bars of lower element 400 so that upper element 500 can be placed on the pins of lower element 400 by placing the holes 540 in the four corners of each large hole on the pins 440.

Figure 6:
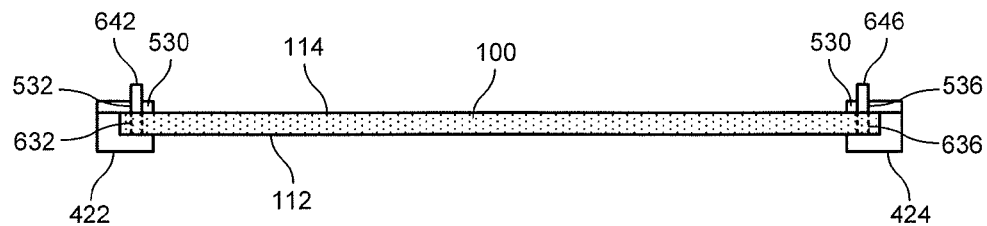
FIG. 6 is a side view along line 6-6 of FIGS. 4 and 5 at the beginning of a component assembly process.

FIG. 6 is a cross-section along line 6-6 of FIGS. 4 and 5 that depicts the relationship between lower element 400, upper element 500 and a device substrate 100 when the device substrate is placed on the pins of the lower element and the upper element is placed over the substrate. Device substrate 100 is mounted between bars 422, 424 which extend parallel to one another perpendicular to the plane of the drawing. Substrate 100 has first and second major surfaces 112, 114 with four holes in its four corners similar to those of the embodiment of FIGS. 1 and 2. In the side view of FIG. 6, two holes 632, 636 in two corners of substrate 100 are shown mounted on pins 642, 646, respectively, in bars 422, 424. It will be understood that two more holes (not shown) in the remaining corners of the substrate are similarly mounted on two more pins (not shown) appropriately located behind pins 642, 646 on bars 422, 424.

Upper element 500 is mounted on pins 440 of lower element 400 so as to secure device substrate 100 between the upper and lower elements. In particular, as shown in FIG. 6, holes 532, 536 in two triangular segments 530 at the corners of a large hole are shown mounted on pins 642, 646, respectively, on bars 422, 424. It will be understood that two more holes (not shown) in the remaining corners of the same large hole are similarly mounted on two more pins (not shown) appropriately located behind pins 642, 646 on bars 422, 424.

The four pins in the four holes in substrate 100 hold substrate 100 substantially rigid during component and package assembly processes. By way of example but not limitation, such processes include the mounting of semiconductor integrated circuits (die) on a substrate, the mounting of bonding pads or other connectors, the sealing of the package, and the mounting of a lid. They also include package assembly processes such as the mounting of the package on printed circuit boards (PCBs) or the like.

Figure 7:
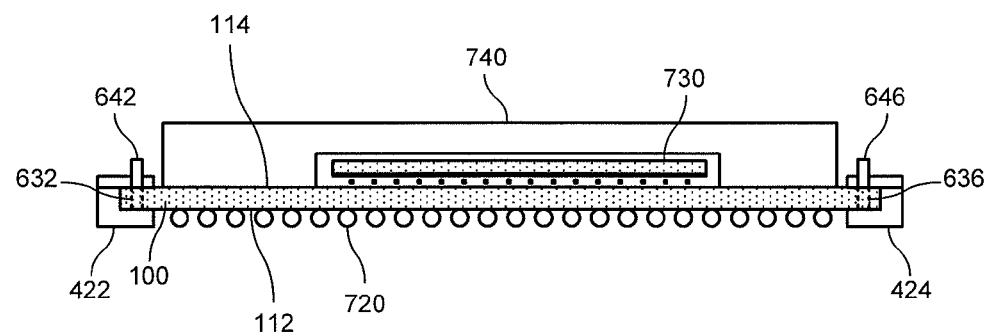
FIG. 7 is a side view along line 6-6 near the end of a component assembly process.

FIG. 7 is a side view depicting substrate 100 near the end of the component assembly process after a ball grid array 720 has been mounted on first major surface 112 of substrate 100 and an integrated circuit 730 and a lid 740 have been mounted on second major surface 114 of substrate 100. Again, substrate 100 is mounted on pins 642, 646 as well as two pins that are not shown.

Figure 8:
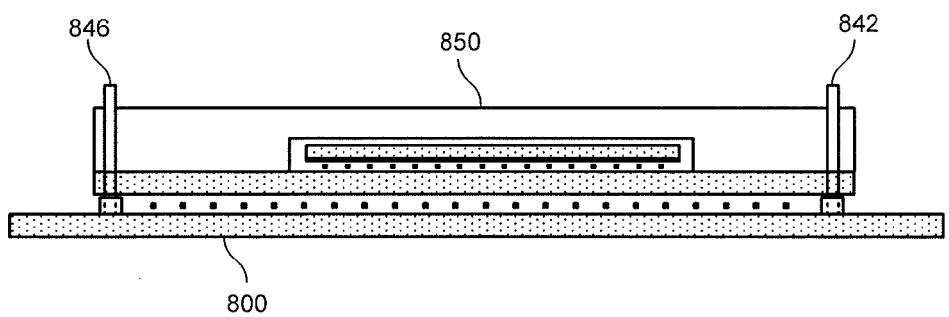
FIG. 8 is a side view of an illustrative printed circuit board assembly process in accordance with the invention.

The holes in substrate 100 may advantageously be used to mount the finished package on PCB 800 as shown in the side view of FIG. 8. There, pins 842, 846 are shown mounted on PCB 800 and extending through two holes near the front two corners of an integrated circuit package 850 that is similar to that of FIG. 7. As will be appreciated, two additional holes (not shown) are located in the back two corners of package 850 and are mounted on two additional pins (not shown) behind pins 842, 846.

Figure 9:
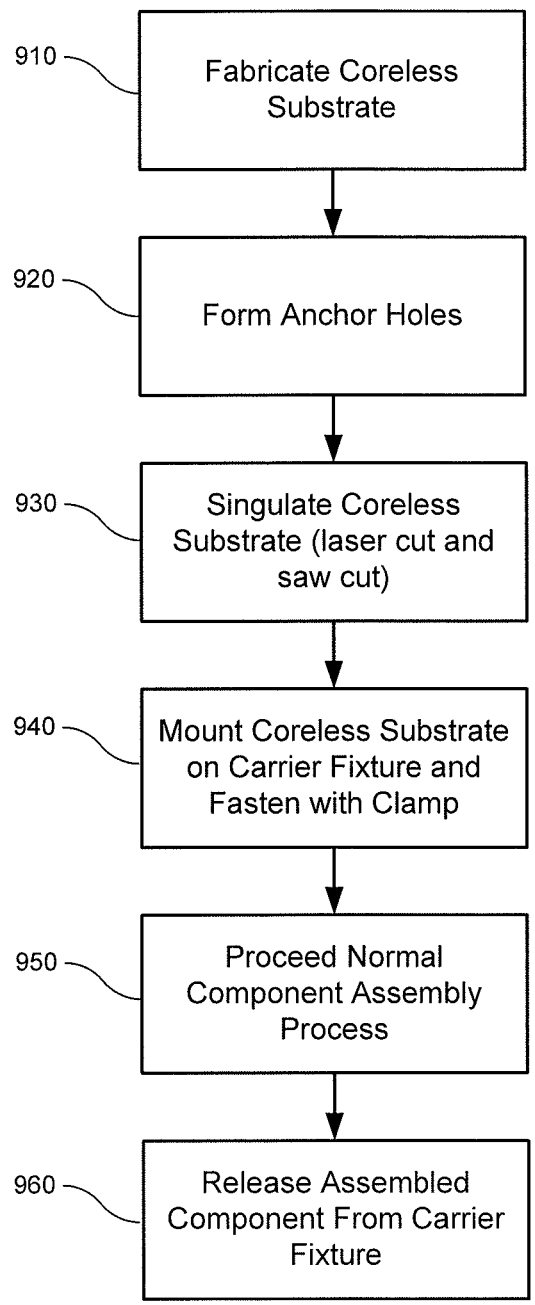
FIG. 9 is a flow chart depicting a first illustrative method for practicing the invention.

FIG. 9 is a flow chart depicting an illustrative process of the invention as may be practiced with an embodiment similar to that of FIG. 3. At step 910, a plurality of coreless, organic substrates is formed in a sheet following conventional practices. At step 920, holes are formed near the four corners of each substrate in the sheet. At step 930, the sheet is cut apart so as to separate the sheet into the different device substrates. The sheet may be separated by scribing the sheet with a laser or a saw.

At step 940, each device substrate is then mounted on the pins of a mounting frame such as that shown in FIGS. 4-7 and secured to the mounting frame. At step 950, components are mounted on each substrate. And at step 960, the substrates are released from the frame and removed.

Figure 10:
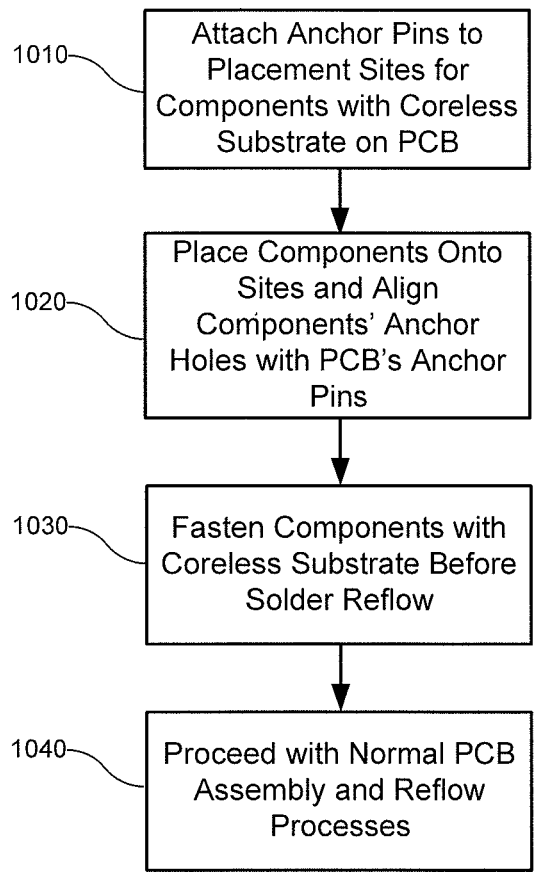
FIG. 10 is a flow chart depicting a second illustrative method for practicing the invention.

FIG. 10 is a flow chart depicting a second illustrative process of the invention in which a device component with a coreless, organic substrate is mounted on a PCB. At step 1010, anchor pins are mounted on a PCB. At step 1020, a device component is mounted on the anchor pins. At step 1030, the device component is fastened to the PCB before any solder reflow. At step 1040, conventional PCB assembly and reflow processes are performed to complete the process.

As will be apparent to those skilled in the art, numerous variations may be practiced within the spirit and scope of the present invention. For example, a variety of different materials may be used in the coreless, organic substrates. Different carrier fixtures may be used to mount the substrates and hold them in place during placement of components.

What is claimed is:

1. Apparatus for mounting electrical components comprising:
    a first coreless, organic substrate having first and second major surfaces and four corners;
    holes extending through first portions of the first coreless, organic substrate near each corner;
    pins that pass through the holes near each corner of the first coreless, organic substrate; and
    an electrical circuit on a second portion of the first coreless, organic substrate, wherein the first portions of the first coreless, organic substrate comprising the holes and the second portion of the first coreless, organic substrate under the electrical circuit are a single contiguous substrate.

2. The apparatus of claim 1 wherein the first substrate is an epoxy resin.

3. The apparatus of claim 1 further comprising a plurality of electrical conductors running through the first substrate.

4. The apparatus of claim 3 further comprising an array of bonding pads formed on at least one of the major surfaces of the first substrate and connected to the electrical conductors.

5. The apparatus of claim 3 further comprising a first array of bonding pads formed on the first major surface of the first substrate, wherein the electrical circuit is on the second major surface of the first substrate, at least some of the bonding pads of the first array being connected by some of the electrical conductors to the electrical circuit on the second surface.

6. The apparatus of claim 1 wherein the pins are mounted on a printed circuit board.

7. The apparatus of claim 1 further comprising at least a second coreless, organic substrate having first and second major surfaces and four corners with holes extending through the second substrate near each corner, said second coreless organic substrate being formed in a sheet of material alongside the first coreless, organic substrate.

8. The apparatus of claim 7 wherein each coreless, organic substrate is rectangular.

9. A method for assembling electrical components on a substrate comprising:
    forming holes near corners of a first substrate;
    mounting the first substrate on pins that pass through the holes near the corners of the first substrate;
    mounting the electrical components on the first substrate while the first substrate is mounted on the pins; and
    mounting an integrated circuit package on the pins, wherein the pins extend through holes near corners of the integrated circuit package, and wherein the integrated circuit package extends over the first substrate and the electrical components.

10. The method of claim 9 further comprising the step of securing the first substrate on the pins.

11. The method of claim 9 wherein the first substrate is a coreless, organic substrate.

12. The method of claim 11 wherein the first substrate is an epoxy resin.

13. The method of claim 9 further comprising at least a second substrate having holes extending through the second substrate near each corner of the second substrate, said second substrate being formed in a sheet of material alongside the first substrate.

14. The method of claim 13 further comprising separating the first and second substrates from the sheet of material before mounting the first and second substrates on the pins.

15. The method of claim 9 further comprising:
mounting the pins on a printed circuit board.

16. A method for assembling electrical components on a substrate comprising:
forming a plurality of substrates in a sheet of organic material;
forming holes near corners of each substrate;
separating the substrates from the sheet of organic material;
mounting the substrates on pins that pass through the holes near the corners of each substrate;
mounting the electrical components on the substrates while the substrates are mounted on the pins; and
mounting a subset of the pins on a printed circuit board, wherein the subset of the pins extend through holes near corners of an integrated circuit package for one of the substrates.

17. The method of claim 16 further comprising the step of securing the substrates on the pins.

18. The method of claim 16 wherein each substrate is a coreless, organic substrate.

19. The method of claim 18 wherein each substrate is an epoxy resin.

20. The method of claim 16 wherein each substrate is rectangular.

21. Apparatus for mounting electrical components comprising:
a sheet of a coreless organic substrate;
a first coreless, organic substrate formed in said sheet and having first and second major surfaces and four corners and holes extending through the first substrate near each corner;
a second coreless, organic substrate formed in said sheet and having first and second major surfaces and four corners and holes extending through the second substrate near each corner; and
pins that pass through the holes near each of the four corners of each of the first and second coreless, organic substrates; and
an integrated circuit package that extends over the first coreless, organic substrate, wherein a subset of the pins that pass through the holes of the first coreless, organic substrate extend through holes near corners of the integrated circuit package.

22. The apparatus of claim 21 wherein the sheet is an epoxy resin.

23. The apparatus of claim 21 further comprising a plurality of electrical conductors running through the sheet.

24. The apparatus of claim 23 further comprising an array of bonding pads formed on at least one of the major surfaces of the first substrate and connected to the electrical conductors.

25. The apparatus of claim 23 further comprising a first array of bonding pads formed on the first major surface of the first substrate and an electrical circuit formed on the second major surface of the first substrate, at least some of the bonding pads of the first array being connected by some of the electrical conductors to the electrical circuit formed on the second surface.

26. The apparatus of claim 21 wherein the subset of the pins are mounted on a printed circuit board.

27. The apparatus of claim 21 wherein the first and second substrates are formed in the sheet alongside one another.

* * * * *